United States Patent
Shaw et al.

(10) Patent No.: US 11,806,760 B2
(45) Date of Patent: *Nov. 7, 2023

(54) SYSTEMS AND METHODS FOR SORTING AND COLLECTING ENHANCED METAL-BEARING ORES OF A DESIRED SIZE FROM METAL-BEARING ORES

(71) Applicant: CD PROCESSING LTD., London (GB)

(72) Inventors: Daniel Shaw, Haverford, PA (US); James Saville, Easton, MD (US)

(73) Assignee: CD Processing Ltd., London (GB)

( * ) Notice: Subject to any disclaimer, the term of this patent is extended or adjusted under 35 U.S.C. 154(b) by 215 days.

This patent is subject to a terminal disclaimer.

(21) Appl. No.: 17/294,230

(22) PCT Filed: Nov. 5, 2019

(86) PCT No.: PCT/IB2019/059505
§ 371 (c)(1),
(2) Date: May 14, 2021

(87) PCT Pub. No.: WO2020/109893
PCT Pub. Date: Jun. 4, 2020

(65) Prior Publication Data
US 2022/0016674 A1   Jan. 20, 2022

Related U.S. Application Data

(63) Continuation of application No. 16/582,104, filed on Sep. 25, 2019, now Pat. No. 10,799,916.
(Continued)

(51) Int. Cl.
*B07C 5/344* (2006.01)
*B07C 5/36* (2006.01)
*G01N 24/08* (2006.01)

(52) U.S. Cl.
CPC .............. *B07C 5/344* (2013.01); *B07C 5/361* (2013.01); *G01N 24/081* (2013.01); *B07C 2501/0018* (2013.01); *B07C 2501/0036* (2013.01)

(58) Field of Classification Search
CPC . B07C 5/344; B07C 5/361; B07C 2501/0018; B07C 2501/0036; B07C 5/36; G01N 24/081; G01R 33/307; C22B 1/00
(Continued)

(56) References Cited

U.S. PATENT DOCUMENTS 4,295,881 A * 10/1981 Saville ...................... B03D 1/02
  75/10.67
8,967,384 B2 * 3/2015 Kingman ................ B07C 5/363
  209/4
(Continued)

FOREIGN PATENT DOCUMENTS

CA       2854654 A1    6/2013
WO    2011075768 A1    6/2011
(Continued)

OTHER PUBLICATIONS

Chilean Office Action dated Jul. 20, 2022 for Application No. 202101358.
(Continued)

*Primary Examiner* — Gene O Crawford
*Assistant Examiner* — Muhammad Awais
(74) *Attorney, Agent, or Firm* — Caesar Rivise, PC (57) ABSTRACT

Disclosed is a system and method for sorting copper-bearing ore to select portions having a target copper content. The system includes an analysis and selection station including first magnetic resonance analyzer measuring the copper content of input ore and a controlled diverter to divert portions of the input ore to a collection path when the copper
(Continued)

content meets or exceeds a predetermined cut-off value. The predetermined cut-off is adjusted by a controller in response to the first magnetic resonance analyzer. A second magnetic resonance analyzer measures the copper content of the ore in a product path. That measurement is fed back to the controller to fine tune the adjusted cut-off value above, up or down, to optimize the yield of ore having the targeted copper content. The system may include a station for sizing the input ore, a station for sizing the output ore, and a station for sizing waste produced by the system.

10 Claims, 6 Drawing Sheets

Related U.S. Application Data

(60) Provisional application No. 62/771,280, filed on Nov. 26, 2018.

(58) Field of Classification Search
USPC .......................................................... 209/567
See application file for complete search history.

(56) References Cited

U.S. PATENT DOCUMENTS

| | | | | |
|---|---|---|---|---|
| 9,316,537 B2* | 4/2016 | Bamber | ................ | G01N 21/27 |
| 9,968,945 B1* | 5/2018 | Filmer | ................ | C22B 3/04 |
| 9,968,947 B2* | 5/2018 | Pieralisi | ................ | B04B 1/14 |
| 10,799,916 B2* | 10/2020 | Shaw | ................ | B07C 5/36 |
| 2013/0201481 A1* | 8/2013 | Bamber | ................ | B07C 5/344 |
| | | | | 356/402 |
| 2014/0262968 A1* | 9/2014 | Fritz | ................ | B03B 7/00 |
| | | | | 241/60 |
| 2015/0122705 A1* | 5/2015 | Latti | ................ | G01N 33/24 |
| | | | | 209/555 |
| 2018/0238976 A1* | 8/2018 | Miljak | ................ | G01N 24/081 |
| 2018/0246047 A1* | 8/2018 | Miljak | ................ | G01N 24/081 |
| 2018/0369869 A1* | 12/2018 | Filmer | ................ | C22B 11/00 |
| 2021/0023588 A1* | 1/2021 | Shaw | ................ | C22B 1/00 |

FOREIGN PATENT DOCUMENTS

| | | | | |
|---|---|---|---|---|
| WO | WO-2014094038 A1 * | 6/2014 | ............ | B07B 13/00 |
| WO | 2017031537 A1 | 3/2017 | | |
| WO | WO-2018183337 A1 * | 10/2018 | ............ | B07C 5/344 |
| WO | 2020109893 A1 | 6/2020 | | |

OTHER PUBLICATIONS

International Search Report and Written Opinion issued by the European Patent Office dated Mar. 20, 2020 for PCT/IB2019/059505.

English Translation of ID Office Action Appl. No. P00202103849 dated Nov. 9, 2022.

* cited by examiner

SYSTEMS AND METHODS FOR SORTING AND COLLECTING ENHANCED METAL-BEARING ORES OF A DESIRED SIZE FROM METAL-BEARING ORES

CROSS-REFERENCE TO RELATED APPLICATIONS

This U.S. national phase application takes its priority under 35 U.S.C. §371 from international application PCT/IB2019/059505 filed on Nov. 5, 2019 which in turn is a Continuation-In-Part of, and takes the benefit under 35 U.S.C. § 120 of, application Ser. No. 16/582,104 (now U.S. Pat. No. 10,799,916) filed on Sep. 25, 2019, entitled Systems and Methods for Sorting and Collecting Enhanced Grade Metal-Bearing Ores from Metal Bearing Ores, which in turn takes the benefit under 35 U.S.C. § 119(e) of Provisional Application Ser. No. 62/771,280 filed on Nov. 26, 2018, entitled Systems and Methods for Sorting and Collecting Enhanced Grade Metal-Bearing Ores from Metal Bearing Ores, the disclosures of both of those applications being specifically incorporated by reference herein.

FIELD OF THE INVENTION

This invention relates generally to mining and more particularly to systems and methods for sorting and collecting a predetermined grade metal-bearing ore, e.g., copper-bearing ore, from metal-bearing ore.

SPECIFICATION

Background of the Invention

The mining of metals, such as copper, from metal-bearing ore typically entails initially taking core samples of an orebody to determine the potential grades of the ore therein. Porphyry copper orebodies are typically very large (hundreds of millions of tons) but low grade—typically less than 1.0% copper content. They may contain other valuable metals—gold, silver, molybdenum and magnetite as well as deleterious minerals containing arsenic and sulphur. The copper ore may be mined by open pit or underground methods depending on the shape and extent of the orebody. The orebodies were formed by a process of magma flow and then the metallic minerals were deposited from flow of hydrothermal mineralizing fluids containing metallic compounds along a network of veinlets and cracks through the cooling magma over millions of years. Typically most (e.g., 75%+) of copper minerals are found as small crystalline particles in the quartzite and volcanic breccia depositions in host rocks of the orebody close to the weathered surface with the balance disseminated in the host rocks. Chalcopyrite ($CuFeS_2$) is the most common copper mineral and bornite, covellite and chalcocite are often found in the weathered sections close to the surface.

Most orebodies are heterogeneous with regions of high grade, medium or low grade ore interspersed with large and small volumes of barren waste rock that may be considered as internal or external dilution of regions of the ore. In open pit mines the geological boundaries between minerals of different grades are defined by core drilling and blast hole drilling and inspection of the ore after blasting of blocks of ore. The broken rock areas after blasting and excavation are delineated by grade for processing or disposal as low grade ore or waste rock. The purpose of ore sorting of ore is to separate acceptable grade ore material at a desired average grade, hereinafter "target grade", from lower grade ore and waste rock for further processing and recovery of valuable minerals.

Bulk ore sorting of batches of ore offers the mine owner the opportunity to economically maximize the recovery and the quality of the ore from the mine since the low grade or marginal grade ore, while not high-grade, will nevertheless contain portions of ore of desired average percent by weight of the copper which could otherwise be wasted and not recovered. While sorting of ore on a moving conveyor has been accomplished heretofore, it has been done at a relatively low speed via the use of systems and methods such as and including X-ray fluorescence analysis, X-Ray Transmission, gamma neutron activation analysis and particle color sensors to identify particles of ore that contain sufficient percent of copper therein. Those sensors are used to sense the particular ore pieces or particles carried on the conveyor past the sensor and to provide signals to some mechanical or pneumatic device to select those ore pieces or particles that are deemed to have a sufficient percent copper in them and divert the selected pieces for subsequent collection and use.

The Commonwealth Scientific and Industrial Research Organisation (CSIRO) of Australia has developed a magnetic resonance apparatus or analyzer (MRA) for conducting on-line measurements of ore-bearing rock carried on a moving conveyor to measure the grade of specific elements or minerals in the ore. International Application WO2017/031537 discloses that apparatus or analyzer. The MRA can be "tuned' to rapidly identify and count the number of chalcopyrite crystals in ore particles independent of the composition of the surrounding rock. In particular, the MRA can be used to count the number of particles of chalcopyrite in a "slice" consisting of many pieces of ore placed inside the radio frequency coil. If the weight of the ore in the slice is known, the count can be converted to weight of chalcopyrite in the total mass of material, i.e., weight % of chalcopyrite. For a given orebody type of host rock and minerals present, the MRA result can be calibrated to calculate the total copper content of the slice of ore.

NextOre Pty Ltd, of Australia, a joint venture between CSIRO, RFC Ambrian and Advisian Digital, is presently making available MRA sensors for ore sorter systems. The MRA sensor serves to measure the grade of a crushed run-of-mine ore to enable the selection of consecutive slices of material, hereinafter "pods" of material, with an average total copper content above a predetermined cut-off grade from pods of material below that cut-off grade to produce higher grade but lower tonnage mill feed. The MRA sensor coil is located surrounding the belt carrying the crushed ore pieces bearing the target mineral (the "feed') to measure the quantity of the target mineral therein. The data resulting from the MRA measurement is combined with data from an associated belt weightometer to enable the calculation of the grade of the pod of feed material. That information can then be used to control a diverter apparatus located adjacent the terminus of the conveyor to direct pods of the feed material above a user-specified minimum grade (e.g., a "cut-off grade") to a station for collection, and pods of the feed material below that user-specified cut-off grade to a station for disposal as waste. The more heterogeneous the ore-bearing material, the more effective the sorter system is owing to the nature of the MRA sensor to identify and measure the mineral content of the pods and thereby copper content of pods that are above or below a cut-off grade.

The MRA sensor is able to quantify the mineral phases of copper-bearing ore via the excitation of the mineral phases by a radio frequency (RF) pulse to elicit an echo signal. For example, chalcopyrite has a resonance for copper (Cu) at 18.46 MHz, therefore the strength of the response as measured by the sensor can be used to quantify the concentration of chalcopyrite in the ore.

As will be appreciated by those skilled in the art since the above described prior art sorting criteria is based on an average cut-off grade, the portions of the pods which were accepted and collected may have more than the desired percentage of the copper therein, and some of the portions of the pods passed to waste may have sufficient amounts of the copper therein when added to the higher grade pods to result in the sorted ore product having the desired average percentage grade, i.e., target grade. Thus, if those portions of the pods having sufficient amounts of the copper therein that would have otherwise been relegated to waste are recovered, they can increase the yield of feed material at the target grade.

The subject invention provides a means and methods for optimizing yields from copper-bearing ore utilizing MRA sensing. Thus, if some of those portions of the pods that would have otherwise been relegated to waste are recovered, they can increase the yield at the target grade. Moreover, value can be gained from low-grade stockpiles or resources of declining grade if they are sufficiently heterogeneous to permit separation of higher grade material from lower grade material. Further still, with the subject invention used to recover higher grade pods from lower grade ore, one can increase reserves of recoverable ore. The use of this ore sorting system with lower grade material to produce additional feed to the ore concentrator at the target grade improves overall mining recovery without displacing higher grade feed, and delivers effective reductions in mining costs per unit of metal produced. Further still, the subject invention enables one to provide a higher and/or more consistent grade material, more pounds of metal per ton of feed material, all the while reducing processing costs, and possibly reducing plant size and concomitant capital costs to achieve the same or higher level of metal production.

It should be pointed out at this juncture that while the subject invention will be described with reference to sorting of copper-bearing ores, it is not so limited. Thus, the subject invention can be used for optimizing the sorting and collection of other metal-bearing ores, e.g., copper nickel ores, iron ores.

All prior art references cited in this application are specifically incorporated herein in their entireties

BRIEF SUMMARY OF THE INVENTION

One aspect of this invention is a system for producing pieces of a product metal-bearing ore by processing pieces of an input metal-bearing ore. The input metal-bearing ore has a metal therein. The product metal-bearing ore has a desired target average percentage by weight of the metal therein. The system comprises a first conveyor, a second conveyor, a first magnetic resonance analyzing unit and an associated controller, a diverter, and a second magnetic analyzing unit. The first conveyor is configured to receive the input metal-bearing ore. The second conveyor is configured to carry pieces of the product metal-bearing ore for collection after the system has processed the input metal-bearing ore. The first magnetic resonance analyzing unit and an associated controller are configured for measuring the percentage by weight of the metal in the input metal-bearing ore on the first conveyor at successive points in time, calculating the average percentage by weight of the metal in the input metal-bearing ore on the first conveyor measured over first predetermined length intervals of time, establishing a cut-off value of the average percentage by weight of the metal in the input metal-bearing ore on the first conveyor for producing the product metal-bearing ore, producing select signals when the average percentage by weight of the metal in the input metal-bearing ore on the first conveyor is equal to or greater than the cut-off value, generating an estimate of the average percentage by weight of the metal in the product metal-bearing ore, and dynamically adjusting the cut-off value up or down to an adjusted value to produce the select signals if the average percentage by weight of the metal in the input metal-bearing ore on the first conveyor is below or above the estimate of the average percentage by weight of the metal in the input metal-bearing ore on the first conveyor. The diverter is configured for receiving the input metal-bearing ore from the first conveyor and directing the input metal-bearing ore on the first conveyor to a collection path in response to the select signals when the average percent by weight of the metal in the input metal-bearing ore on the first conveyor is equal to or greater than the adjusted value and directing the input metal-bearing ore on the first conveyor to a waste path when the average percent by weight of the metal in the input metal-bearing ore on the first conveyor is less than the adjusted value. The second magnetic resonance analyzing unit is configured for measuring the percentage by weight of the metal in the product metal-bearing ore on the second conveyor and for providing to the controller signals to fine tune the adjusted value up or down to a tuned adjusted value to produce the select signals if the average percentage by weight of the metal in the product metal-bearing ore on the second conveyor is below or above the desired target average percentage by weight of the metal in the product metal-bearing ore, thereby causing the diverter to direct the input metal-bearing ore on the first conveyor to the collection path when the average percent by weight of the metal in the input metal-bearing ore on the first conveyor is equal to or greater than the tuned adjusted value and to direct of the input metal-bearing ore on the first conveyor to the waste path when the average percent by weight of the metal in the input metal-bearing ore on the first conveyor is less than the tuned adjusted value.

In accordance with one preferred aspect of the system of this invention the controller is configured for collecting data from the first magnetic resonance analyzing unit and organizing that data into trend lines. Each of the trend lines has a direction and slope and is a line of best fit for the sequential measurements of the percentage by weight of metal in the input metal-bearing ore measured over the first predetermined length intervals of time on the first conveyor. The controller is configured for dynamically adjusting the cut-off value up or down to the adjusted value as a function of the direction and slope of the trend lines.

In accordance with another preferred aspect of the system of this invention each of the conveyors are at least 75 feet long, wherein the predetermined speed of the first conveyor is in the range of 180 to 600 feet per minute, and wherein the first predetermined period of time is in the range of 1 to 10 seconds.

In accordance with another preferred aspect of the system of this invention the metal-bearing ore is copper-bearing ore and wherein the metal is copper.

In accordance with another preferred aspect of the system of this invention the desired target average percentage by weight of the copper is approximately 0.3%.

In accordance with another preferred aspect of the system of this invention the diverter is a selected from the group consisting of a pivoting chute diverter, a diverter gate valve and a flop gate.

In accordance with another preferred aspect of the system of this invention the system additionally comprises an ore crusher to reduce the size of the pieces of the product metal-bearing ore so that they are no greater than a predetermined maximum size.

In accordance with another preferred aspect of the system of this invention the first conveyor, the first magnetic resonance analyzing unit, the controller, and the diverter form an analysis and selection station and wherein the system additionally comprises an input sizing station and a product output station. The input sizing station comprises a first sizing screen and a first ore crusher. The first sizing screen is configured for receiving the pieces of the input metal-bearing ore and for passing those pieces that are no greater than a first predetermined maximum size therethrough to provide processing ore. The first ore crusher being configured to receive pieces of the input metal-bearing ore from the first sizing screen that are greater than the first predetermined maximum size for crushing those pieces to produce the processing ore and providing the processing ore to the first conveyor of the analysis and selection station. The input metal-bearing ore that is diverted from the first conveyor to the collection path being referred to as selected processing ore. The product output station forms a portion of the collection path for producing the product metal-bearing ore and comprises a second ore crusher, a second sizing screen and a third ore crusher. The second ore crusher is configured to receive the selected processing ore to reduce the size of the pieces thereof to produce a reduced size selected processing ore. The second sizing screen is configured for receiving the reduced size selected processing ore and for passing pieces thereof which are no greater than a second predetermined maximum size therethrough to the second conveyor as the product metal-bearing ore. The second predetermined maximum size is less than the first predetermined maximum size. The third ore crusher is configured to receive pieces of the reduced size selected processing ore greater than the second predetermined maximum size from the second sizing screen for crushing the pieces of the reduced size selected processing ore to produce crushed pieces and providing the crushed pieces back to the second sizing screen.

In accordance with another preferred aspect of the system of this invention the input sizing station also comprises a preliminary sizing screen and a preliminary ore crusher. The preliminary sizing screen is configured for providing pieces of the input metal-bearing ore that are no greater than a third predetermined maximum size to the first sizing screen. The third predetermined maximum size is greater than the first predetermined maximum size. The preliminary sizing screen provides pieces of the input metal-bearing ore which are greater than the third predetermined maximum size to the preliminary ore crusher. The preliminary ore crusher is configured to crush the pieces of the input metal-bearing ore from the preliminary sizing screen that are greater than the third predetermined maximum size to a crushed size ore which can be provided back to the preliminary sizing screen.

In accordance with another preferred aspect of the system of this invention the input metal-bearing ore comprises copper-bearing ore, and wherein the first predetermined maximum size is approximately 150 mm, the second predetermined maximum size is approximately 10 mm, and the third predetermined maximum size is approximately 450 mm.

In accordance with another preferred aspect of the system of this invention the input sizing station additionally comprises an apron feeder located between the preliminary sizing screen and the first sizing screen. The apron feeder controls the rate at which the input metal-bearing ore whose pieces are no greater than the third predetermined maximum size are provided to the first sizing screen under the control of a first weighing device. The first weighing device is located adjacent the first conveyor and the first magnetic resonance analyzing unit.

In accordance with another preferred aspect of the system of this invention the first magnetic resonance analyzing unit includes a coil having an internal cross sectional area, and wherein the input sizing station additionally comprises a surge bin configured for receiving the input metal-bearing ore that is no greater than the first predetermined size and for providing such ore to the first conveyor at a controlled rate. The controlled rate results in the amount of input metal-bearing ore on said first conveyor being maintained at approximately 20-30% of the internal cross-sectional area of the coil of the first magnetic resonance analyzing unit.

In accordance with another preferred aspect of the system of this invention the second conveyor and the second analyzer form a portion of the product output station.

In accordance with another preferred aspect of the system of this invention the second magnetic resonance analyzing unit includes a coil having an internal cross-sectional area, and wherein said output sizing station additionally comprises a surge bin configured for receiving the selected processing ore from the analysis and selection station. The selected processing ore is processed in the output sizing station to ensure the size of pieces of the selected processing ore do not exceed a predetermined maximum size to produce the product metal-bearing ore and for providing the product metal-bearing ore to the second conveyor at a controlled rate. The controlled rate results in the amount of product metal-bearing ore on the second conveyor being maintained at approximately 20-30% of the internal cross-sectional area of the coil of the second magnetic resonance analyzing unit.

In accordance with another preferred aspect of the system of this invention the system additionally comprises a waste output station forming a portion of the waste path, wherein the waste output station comprises a waste ore crusher configured to crush the input metal-bearing in said waste path into waste ore pieces having a maximum predetermined size.

In accordance with another preferred aspect of the system of this invention the maximum predetermined size of the waste ore pieces is up to approximately 50 mm.

Another aspect of this invention is a method for producing pieces of a product metal-bearing ore by processing pieces of an input metal-bearing ore. The input metal-bearing ore has a metal therein. The product metal-bearing ore has a desired target average percentage by weight of the metal therein. The method comprises providing the metal-bearing ore on a first conveyor. The percentage by weight of the metal in the input metal-bearing ore on the first conveyor is measured at successive points in time. The average percentage by weight of the metal in the input metal-bearing ore on the first conveyor measured over first predetermined length intervals of time is calculated. A cut-off value of the average percentage by weight of the metal in the input metal-bearing ore on the first conveyor for producing the product metal-bearing ore is established. Select signals when the average percentage by weight of the metal in the input metal-bearing ore on the first conveyor is equal to or greater than the cut-off value are produced. An estimate of the average percentage by weight of the metal in the product metal-bearing ore is generated. The cut-off value is dynamically adjusted up or down to an adjusted value to produce the select signals if the average percentage by weight of the metal in the input metal-bearing ore on the first conveyor is below or above the estimate of the average percentage by weight of the metal in the input metal-bearing ore on the first conveyor. The input metal-bearing ore on the first conveyor is directed to a collection path in response to the select signals when the average percent by weight of the metal in the input metal-bearing ore on the first conveyor is equal to or greater than the adjusted value. The input metal-bearing ore on the first conveyor is directed to a waste path when the average percent by weight of the metal in the input metal-bearing ore on the first conveyor is less than the adjusted value. The percentage by weight of the metal in the product metal-bearing ore on a second conveyor is measured and the adjusted value is fine tuned up or down to a tuned adjusted value to produce the select signals if the average percentage by weight of the metal in the product metal-bearing ore on the second conveyor is below or above the desired target average percentage by weight of the metal in the product metal-bearing ore, whereupon the input metal-bearing ore on the first conveyor is directed to the collection path when the average percent by weight of the metal in the input metal-bearing ore on the first conveyor is equal to or greater than the tuned adjusted value and the input metal-bearing ore on the first conveyor is directed to the waste path when the average percent by weight of the metal in the input metal-bearing ore on the first conveyor is less than the tuned adjusted value.

In accordance with one preferred aspect of the method of this invention the method comprises dynamically adjusting the cut-off value up or down to the adjusted value as a function of a direction and slope of trend lines. Each of the trend lines is a line of best fit of the sequential measurements of the percentage by weight of metal in the input metal-bearing ore measured over the first predetermined length intervals of time on the first conveyor.

In accordance with another preferred aspect of the method of this invention the metal-bearing ore is copper-bearing ore and wherein the metal is copper.

In accordance with another preferred aspect of the method of this invention the desired target average percentage by weight of the copper is 0.3%.

In accordance with another preferred aspect of the method of this invention the method additionally comprises preliminarily sizing the pieces of the input metal-bearing ore so that the pieces thereof are no greater than a first predetermined maximum size and providing those pieces to the first conveyor. The pieces of the input metal-bearing ore provided to the collection path are sized so that the pieces thereof are no greater than a second predetermined maximum size. The second predetermined size is less than the first predetermined maximum size. The pieces of the input metal-bearing ore that are no greater than the second predetermined maximum size are provided to the second conveyor.

In accordance with another preferred aspect of the method of this invention the preliminary sizing of the pieces of the input metal-bearing ore comprises screening pieces of the input metal-bearing ore, whereupon pieces of that ore which are no greater than a third predetermined maximum size are introduced to the first conveyor. The third predetermined maximum size is greater than the first predetermined maximum size. The size of the pieces of the input metal-bearing ore that are greater than the third predetermined maximum size are reduced in size to a size which is no greater than the third predetermined maximum size for introduction to the first conveyor.

In accordance with another preferred aspect of the method of this invention the metal-bearing ore comprises copper-bearing ore and the metal is copper. The first predetermined maximum size is approximately 150 mm, the second predetermined maximum size is approximately 10 mm, and the third predetermined maximum size is approximately 450 mm.

In accordance with another preferred aspect of the method of this invention the method additionally comprises controlling a rate at which the pieces of the input metal-bearing ore which are no greater than the third predetermined maximum size are screened.

In accordance with another preferred aspect of the method of this invention the first magnetic resonance analyzing unit includes a coil having an internal cross sectional area, and wherein the method additionally comprises providing the pieces of the input metal-bearing ore that are no greater than the first predetermined size to the first conveyor at a controlled rate so that the amount of the input metal-bearing ore on the first conveyor is maintained at approximately 20-30% of the internal cross sectional area of said first magnetic resonance analyzing unit.

In accordance with another preferred aspect of the method of this invention the second magnetic resonance analyzing unit includes a coil having an internal cross sectional area, and wherein the method additionally comprises providing the pieces of the product metal-bearing ore that are no greater than the second predetermined size on the second conveyor at a controlled rate so that the amount of the product metal-bearing ore on the second conveyor is maintained at approximately 20-30% of the internal cross sectional area of the second magnetic resonance analyzing unit.

In accordance with another preferred aspect of the method of this invention the method additionally comprises sizing the pieces of the input metal-bearing ore in the waste path so that the pieces thereof are no greater than a fourth predetermined maximum size.

In accordance with another preferred aspect of the method of this invention the fourth maximum predetermined size is approximately 50 mm.

DETAILED DESCRIPTION OF EXEMPLARY PREFERRED EMBODIMENTS OF THE INVENTION

Figure 1:
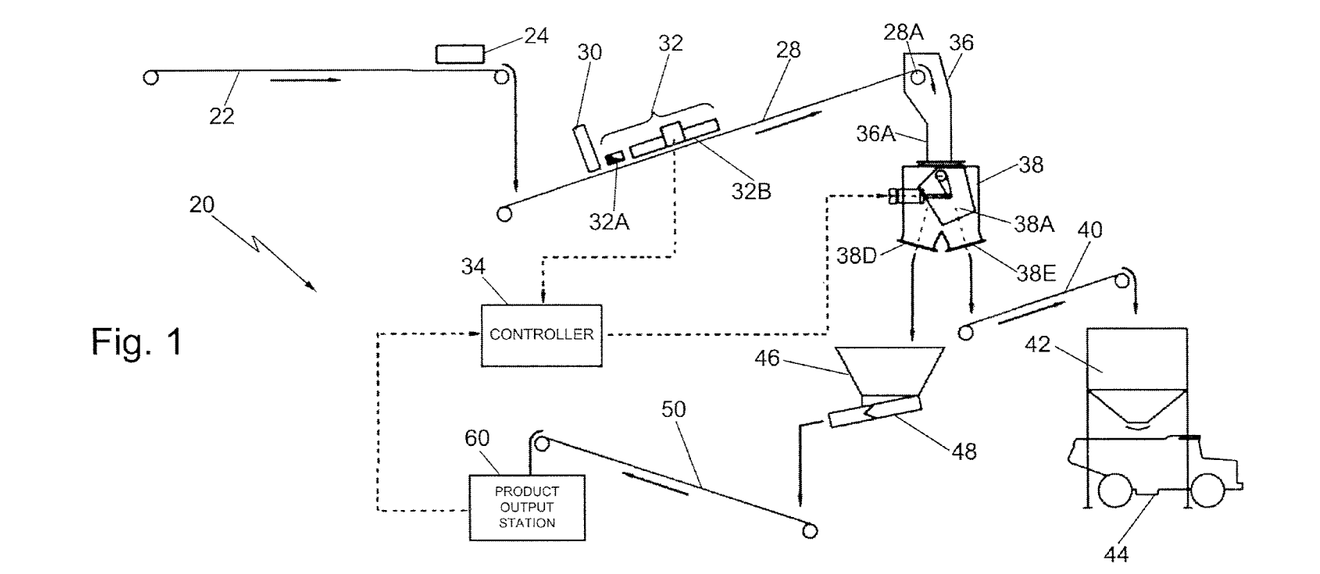
FIG. 1 is an illustrative diagram showing one exemplary embodiment of the sorting system of this invention for sorting and collecting copper-bearing ore having a desired target value of average weight percent of copper therein from copper-bearing ore provided to the system.

Referring now to the various figures of the drawing wherein like reference characters refer to like parts, there is shown in FIG. 1 one exemplary sorting system 20 constructed in accordance with this invention. The sorting system 20 is particularly suited for use in sorting copper-bearing ore, but can be used for sorting other metal-bearing ores. In any case the system 20 is configured to be used to sort low grade or marginal grade ore produced at a mine into ore having a desired average weight percentage content of valuable metal. For copper from a low-grade porphyry orebody, an ore having an average copper content of 0.3% by weight is typically acceptable commercially for further processing and concentration of copper minerals and subsequent smelting to copper metal. It should be noted that the acceptable weight percentage will vary from mine to mine, depending upon a number of various factors. Thus, the target average copper content of 0.3% as used herein is merely exemplary.

As can be seen in FIG. 1, the sorting system 20 includes an input belt conveyor 22 onto which the input metal-bearing ore, e.g., copper-bearing ore from a mine, to be sorted is placed. That ore is carried on the conveyor in the direction shown by the arrow under a magnet 24. The magnet is located at the exit end portion of the conveyor 22 to attract any ferrous material that may be on the conveyor's belt so that such ferrous material does not pass with the ore for sorting. The pieces of ore drop off the exit end of the conveyor 22, whereupon they fall onto another conveyor 28 at the input end thereof. The conveyor 28 may be referred to as a feed conveyor and is preferably a cloth reinforced belt conveyor of conventional construction as this works best with the MR analyzer. Preferably, the feed conveyor 28 is a long, e.g., 75 to 150 feet length, device whose circulating belt moves the ore deposited on the upper surface thereof in the direction of the arrow shown at a predetermined rate of speed, e.g., belt speeds of 500 to 600 feet per minute, and with ore loading of 200 tons per hour up to 2,000 tons per hour.

The ore deposited on the feed conveyor 28 then passes under an adjustable height barrier 30. The barrier 30 is located upstream of a first magnetic resonance analyzer unit 32. The first magnetic resonance analyzer unit 32 includes a conventional belt scale or belt weighing device 32A, sometimes referred to as a "weightometer", and a first magnetic resonance analyzer 32B. The adjustable height barrier 30 serves to prevent any pieces of ore on the belt that extend upward beyond a predetermined height from reaching the analyzer 32B, since such pieces could damage the analyzer. In particular, the barrier 30 serves to "smooth out" the ore on the conveyor to an acceptable height by blocking any pieces of ore extending too high from the belt and causing such pieces to find a position on the belt where they will not extend upward beyond the desired height in order to protect the analyzer.

The belt scale or weightometer 32A of the analyzer unit 32 produces electrical signals representative of the mass of the ore carried by the moving belt of the feed conveyor 28. The magnetic resonance analyzer 32B is located adjacent, e.g., slightly downstream of the weightometer 32A. As will be described in more detail later, the analyzer 32B measures the content of the copper minerals in the pieces of the ore passing through its coil, whereupon the analyzer unit 32B provides first electrical output signals representative of the weight percent of copper in that ore in first predetermined length intervals of time, with each predetermined length interval of time representing a pod on the feed conveyor 28. In one exemplary embodiment of this invention the predetermined speed of the feed conveyor 28 is in the range of 180 feet per minute to 600 feet per minute, and the first predetermined length interval of time is in the range of 1 to 20 seconds. The first output electrical signals are provided to a controller 34. Preferably the controller is a programmable logic controller (PLC) suitable for use in a dusty industrial environment like a mine. Some of details of the PLC controller will be described later. Suffice it for now to state that the controller 34 establishes sorting criteria for deciding when portions or pods of the marginal ore on the feed conveyor 28 are to be selected to be passed to a product path for collection and subsequent processing (e.g., refining into copper), or are to be passed on to waste path for disposal.

Figure 3A:
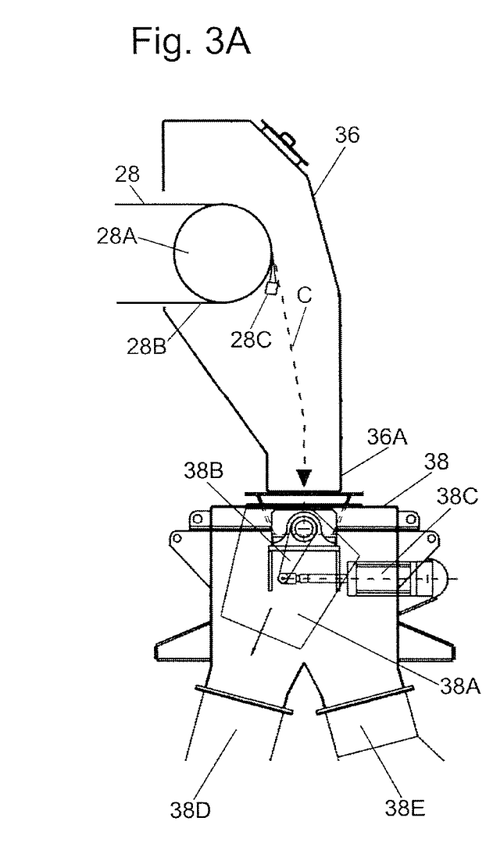
FIG. 3A is an illustration of a pivoting chute diverter forming a portion of the system of FIG. 1, with the diverter being shown in the position wherein it is diverting pods of the desired percentage copper-bearing ore from the ore for subsequent collection.
Figure 3B:
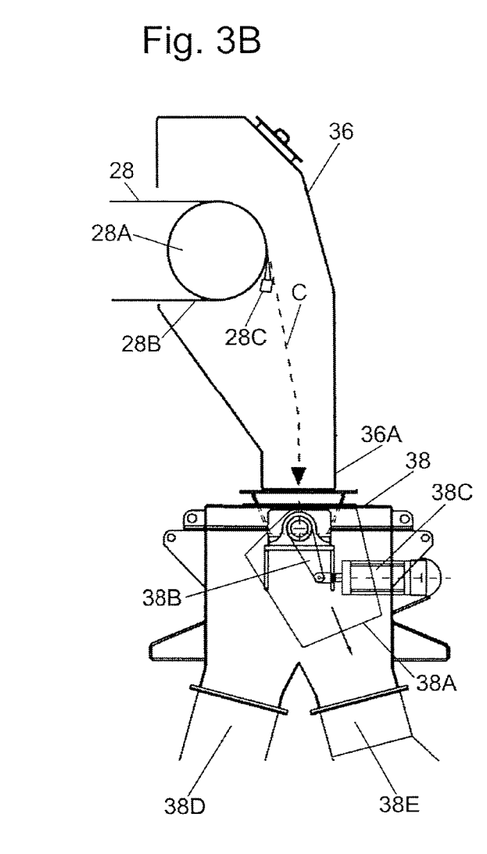
FIG. 3B is an illustration like that of FIG. 3A by showing the chute diverter in the position wherein it is diverting ore not having the desired average weight percent of copper therein for waste.

The output end of the feed conveyor 28, which is in the form of a pulley 28A about which the conveyor's belt 28B extends, is located within the interior of a diverter chute 36 as best seen in FIGS. 3A and 3B and which will be described in detail later. Thus the ore exiting the conveyor 28 drops through the diverter chute 36 into the inlet of a pivoting chute type diverter 38. The details of the pivoting chute diverter 38 will also be described later with respect to FIGS. 2 and 3. Suffice it for now to state that the pivoting chute diverter 38 includes a pivotable spout 38A which is configured to be pivoted from one position (hereinafter referred to as the "select" position) to another position (hereinafter referred to as the "waste" position), and vice versa, under control of the controller 34 in accordance with the sorting criteria. In particular, when the controller 34 determines that a pod of marginal ore on the conveyor 28 does not meet the sorting criteria the pivoting spout 38A will be pivoted to the waste position so that the ore pieces of that pod pass out of a waste outlet chute 38B of the diverter 38 onto a waste conveyor 40 in the waste path. The waste conveyor 40 can be of any type of construction and is configured to carry the waste pieces of ore to a station for disposal. In the exemplary embodiment shown the exit end of the waste conveyor serves to drop the waste ore into a bin 42, from which that ore can be loaded into the bed of a dump truck 44 for disposal.

Those pods of ore that are determined to meet the sorting criteria by the controller 34 are directed into a "collection" or "product" path by the diverter 38. In particular, when the controller determines that a pod of ore on the feed conveyor 28 meets the sorting criteria, the controller provides a signal indicative thereof, hereinafter called a "select" signal, to the diverter 38, to cause its pivotable chute 38A to pivot to the select position. With the spout in that position the ore pieces of the pod will drop out of what can be called the select outlet chute 38D of the diverter 38 and into a bin 46 forming a portion of the product path. The bin 46 includes a vibrating feeder 48, wherefrom the selected ore drops onto another conveyor 50. The conveyor 50 is a conventional conveyor of any suitable construction, preferably a cloth reinforced belt conveyor as this works best with the MR analyzer. Thus, the ore from the diverter referred to as the "product metal-bearing ore" is carried on the belt of the conveyor 50 in the direction of the arrow shown below that conveyor for introduction into a Product Output Station 60.

The Product Output Station 60 is configured for receiving the metal-bearing ore having the desired average target grade of metal (e.g., copper) therein that is on the conveyor 50 (hereinafter referred to as the "selected processing ore" for sizing the pieces of thereof so that none exceeds a desired predetermined maximum (e.g., 10 mm). By so doing one is able to produce a metal-bearing ore, hereinafter referred to as the "product metal-bearing ore", that it particularly suitable for further processing, e.g., to extract the metal thereof.

Figure 2:
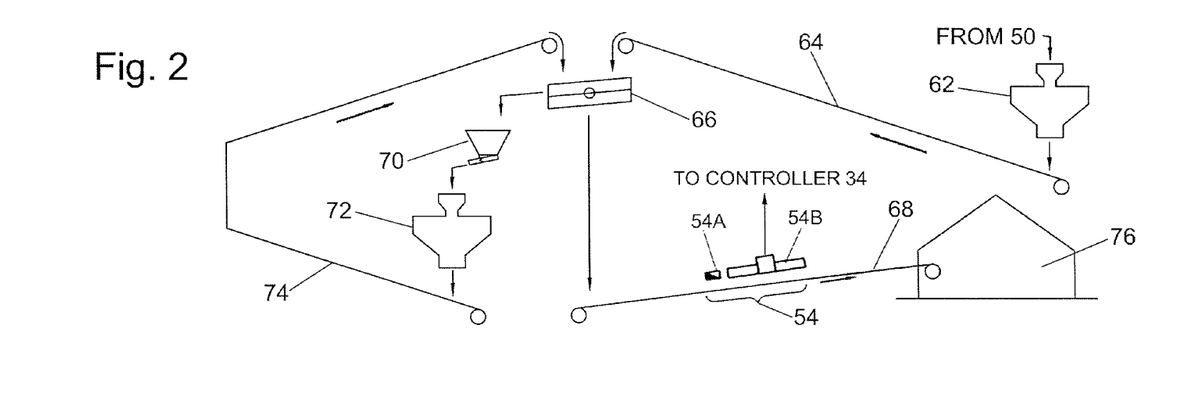
FIG. 2 is an illustrative diagram of the product output station of FIG. 1.

The Product Output Station 60 is best seen in FIG. 2 and basically comprises an adjustable height barrier 52, a second magnetic resonance analyzer unit 54 (made up of a second weightometer 54A and a second magnetic resonance analyzer 54B like the first magnetic resonance analyzer unit), an ore crusher 62, a conveyor 64, a single deck sizing screen 66, a conveyor 68, a surge bin 70, another ore crusher 72, a conveyor 74 and a fine ore bin building 76. The ore crusher 62 is a conventional unit which is configured to crush the selected processing ore from the conveyor 50 into smaller pieces, which are deposited on the conveyor 64, from whence they are carried to the sizing screen 66. Those pieces of ore which do not exceed a predetermined maximum size, e.g., 10 mm, pass through the screen 66 from whence they drop onto the conveyor 68, hereinafter referred to as the "product conveyor" which carries those pieces of ore to the interior of the fine ore bin building 76. Those pieces of ore form the final product of the system 20 and are of the desired target grade and desired size for subsequent processing, e.g., grinding, floatation and smelting.

Those pieces of selected processing ore which are greater than the predetermined maximum size are provided by the sizing screen 66 to the surge bin 70, and from there to the ore crusher 72 The ore crusher 72 is also a conventional unit and serves to crush the ore delivered to it into smaller pieces, which are deposited on the conveyor 74 and carried back to the sizing screen 66. Accordingly those pieces which do not exceed the predetermined maximum size, e.g., 10 mm, pass through the sizing screen 66 onto the conveyor and from there to the fine ore bin building 76. Those pieces which still exceed the predetermined maximum size, e.g., 10 mm, are again directed to the surge bin 70 and from there to the tertiary ore crusher 72. Thus, those pieces of the selected processing ore that are greater than the first predetermined maximum size are provided to the ore crusher 72 for crushing into crushed pieces and the crushed pieces are re-united with the ore pieces below that first predetermined maximum size on the product conveyor 68. The surge bin 70 includes a level sensor and is provided between the sizing screen 66 and the ore crusher 72 to ensure that the rate of delivery of the ore to the ore crusher 72 is optimized.

As mentioned above, the second magnetic resonance analyzer unit 54 is constructed like the first magnetic resonance analyzer unit 32 and thus includes a second weightometer 54A and a second magnetic resonance analyzer 54B. The second weightometer is located slightly upstream of the second magnetic resonance analyzer 54B. The second magnetic resonance analyzer 54B measures the content of the copper in the pieces of the product ore passing through its coil, whereupon it provides second electrical output signals to the controller 34 which are representative of the actual weight percent of copper in the product ore in second predetermined length intervals of time, with each such second predetermined length interval of time representing a group of pods on the product conveyor 68. In accordance with one exemplary aspect of this invention the predetermined speed of the conveyor 68 is in the range of 180 feet per minute to 600 feet per minute, and the second predetermined length interval of time is in the range of 20 to 300 seconds.

Each of the magnetic resonance analyzers 32B and 54B is preferably constructed in accordance with the teachings of the aforementioned CSIRO International Application WO2017/031537 and use high frequency radio waves to rapidly measure the copper mineral content of all of the pieces of ore on the associated conveyor's belt as they pass through the analyzer's coil (not shown). Each of the analyzer's coils has a predetermined internal cross-sectional area which is designed to completely surround the conveyor belt. Each analyzer provides electrical output echo signals representative of the concentration of the selected or target mineral phase of copper, e.g., chalcopyrite, in the ore to the controller 34. That controller includes a computer (not shown) and associated software (not shown) and is configured to receive electrical signals from the weightometers 32A and 54A and the analyzers 32B and 54B, respectively, to calculate the average percentage by weight of a particular, and preselected, copper bearing mineral, e.g., chalcopyrite, in the ore on the conveyors 28 and 68, respectively, over separately predetermined length intervals of time, i.e., the first predetermined length intervals of time and the second predetermined length intervals of time, respectively.

Each analyzer unit is capable of providing accurate measurement of the copper content of the ore on the associated conveyor's belt very quickly. Thus, the counting measurement is very fast, e.g., about 0.1 millisecond per slice of the cross-section of ore on the belt. In order to develop meaningful analyses for industrially meaningful weight of ore, the analyses of individual slices are accumulated to accurately define the average copper content of a larger mass of ore. For example, the analyzer units can be set up to calculate copper content of the ore as weight percent averaged every 2-5 seconds for a pod size of about 0.66-1.65 tons at a 1,200 tons per hour feed rate.

As will be appreciated by those skilled in the art the analyzer units 32 and 54 have to operate with a desired fill factor of ore on their associated conveyors 28 and 68, respectively, to ensure that they provide an accurate analysis of the ore on those conveyors. In particular, the analyzer units of the subject invention require that the cross-section area of the ore material on the conveyors 28 and 68 be kept relatively constant, e.g., be approximately 20%-30% of the cross-section area of the interior of the MR analyzer's coil.

Thus, collection or surge hoppers are provided in the system 20 to ensure that the ore on the conveyors 32 and 68 is at the desired fill factor.

The first magnetic resonance analyzer unit 32B has three purposes. The first purpose is to determine the average weight percent of copper in the pods of marginal copper-bearing ore on the conveyor 28 and for providing electrical signals indicative thereof to the controller 34. To that end, the first magnetic resonance analyzer unit 32 measures the copper weight percent content of the slices of copper ore on the feed conveyor 28 and averages the data over integration periods of approximately 2-5 seconds, as selected by the operator and input into the controller. The average analysis is for a specific weight of ore (pod) as measured by the associated belt weighing device 32A with accuracy less than about 1%, preferably less than 0.5%. That data is provided by electrical signals to the controller 34.

Figure 4:
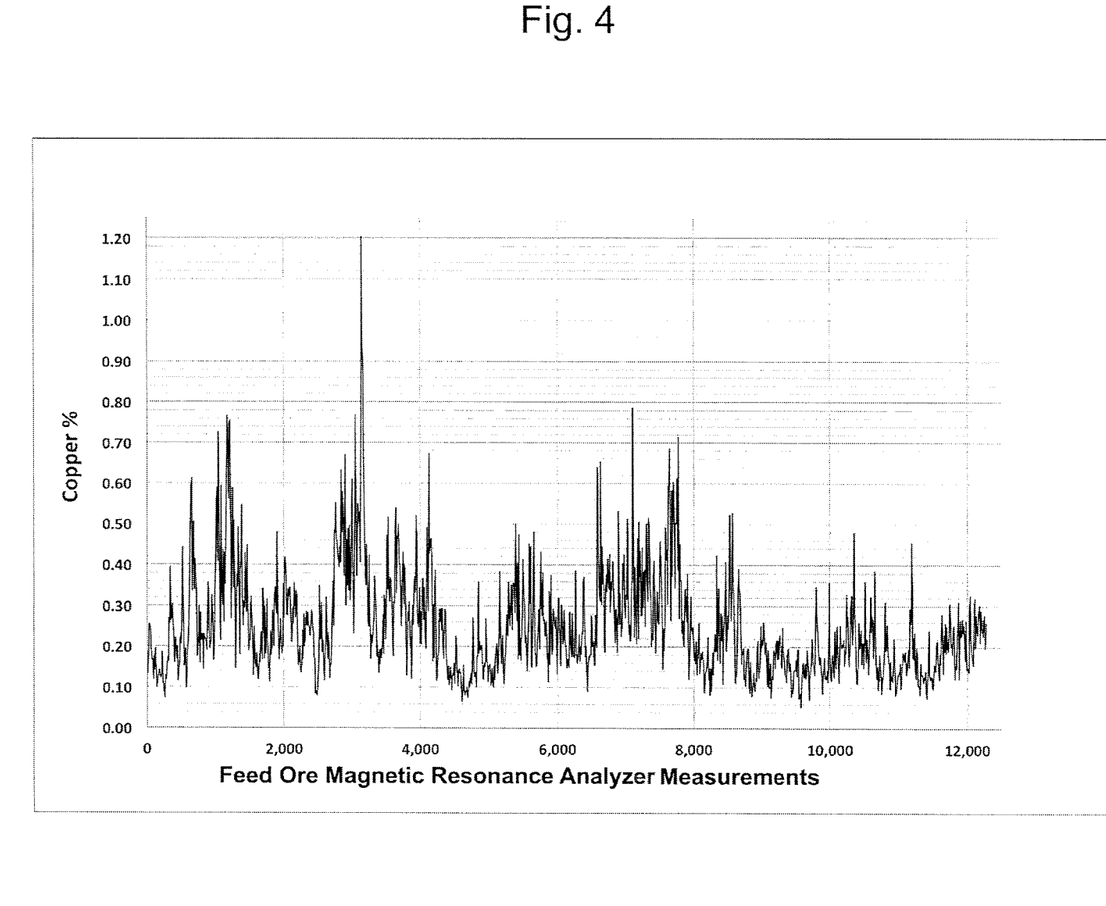
FIG. 4 is a graph of the average weight percentage of copper in the copper-bearing ore plotted against time and made up of plural data points as determined by a first magnetic resonance analyzer unit which forms a portion of the sorting system of FIG. 1.

FIG. 4 is an exemplary graph showing a plot of values of the measured percentage by weight of copper in the copper-bearing ore on the feed conveyor 28 as a function of time, with each of the data points collected to produce the plot representing the average copper content for a 2-5 second integration period with each point representing the average copper content of ore equivalent to one pod of a 0.66-1.65 tons size. Thus, it can be seen that the percentage by weight of copper for the successive pods represented range from approximately 0.08% to 1.2%.

The second purpose of the first analyzer unit 32B is to determine if the average weight percent of the marginal ore on the first conveyor 28 meets or exceeds a predetermined copper content value (which may also be referred to as a cut-off point) which is input into the controller by the user of the sorting system 20, e.g., the plant operator. If the average weight percent of the marginal ore measured over a first predetermined length interval of time meets or exceeds the predetermined cut-off value, the controller provides the heretofore identified "select" signal. That signal is provided to the diverter 38 to cause the pivoting spout 38A of the diverter 38 to be moved to position like shown in FIG. 2, whereupon the marginal ore on the feed conveyor 28 will be sent to the product path, e.g., to the product conveyor 52.

The predetermined cut-off value forms part of the heretofore mentioned sorting criteria. For example, if the user of the system 20 wishes to collect ore having an average weight percent of 0.3, shown by the horizontal line X in FIG. 5, the controller 34 will be set to a cut-off value that the user believes will result in that desired weight percent. In the example of FIG. 4, the initial cut-off value is 0.175% shown by the horizontal line Y in FIG. 5. The cut-off value is initially set by the plant operator or user based on copper analysis information provided by exploration drill-core and blast-hole samples which resulted in the delineating the location of the marginal ore.

The third purpose of the first analyzer unit 32 is to feed back an electrical signal representative of the estimated average copper content of the product metal-bearing ore on the second conveyor 68 to dynamically adjust the cut-off value of the select signal from the controller up or down to an adjusted value, if necessary, to result in a desired target average copper grade of ore to be collected. In particular, if for the example given above, the desired target grade of marginal ore to be sorted and collected for further processing is to have an average weight percent of 0.3, and the initial setting of the cut-off value or set-point of 0.175 percent results in product ore having an estimated average weight percent of 0.4 percent from the measured over the predetermined length interval of time, the feedback signal provided by the analyzer unit 32B to the controller 34 will adjust the controller's cut-off value down to an adjusted value that is below 0.175% to bring the average weight percent of copper of the product ore over a second predetermined length interval of time down to the desired 0.3%. This action will allow more product ore to be collected, thereby increasing the yield and resulting in a more consistent analysis of the product. Conversely, if the feedback signal provided indicates that the product ore pods have an actual average weight percent of 0.28, the feedback signal provided by the analyzer unit 32B to the controller will adjust the controller's cut-off value to an adjusted value that is above the 0.175% set point to bring the average weight percent of the product ore up to the desired target value of 0.3%.

Figure 5:
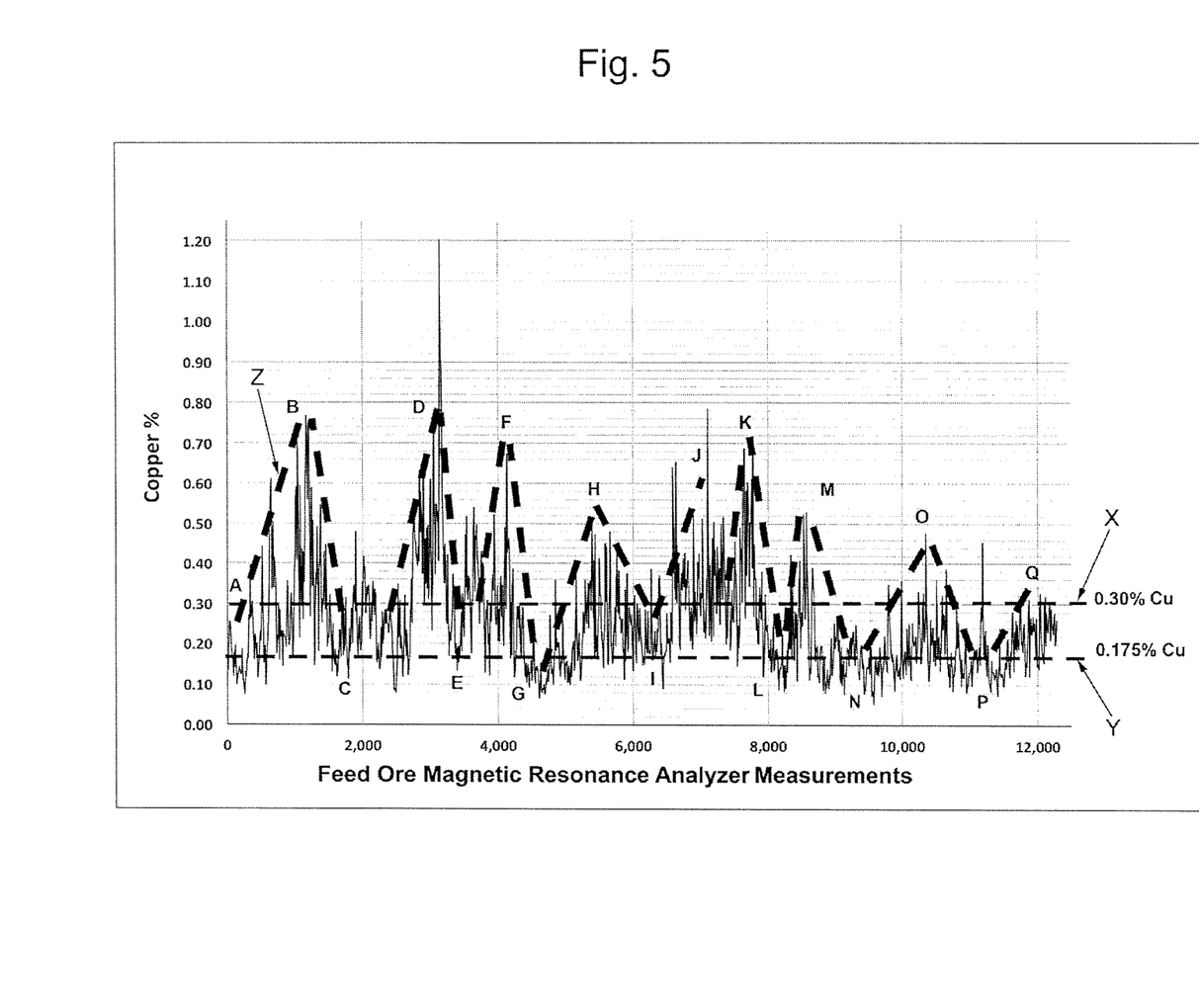
FIG. 5 is a graph like that of FIG. 4, but showing the operating parameters of a controller which also forms a portion of the sorting system of FIG. 1 and which is coupled to the first magnetic analyzer to provide feedback data using slope of consecutive analysis data from the magnetic resonance analyzer and associated weighing device to dynamically adjust the cut-off value used to direct the operation of the diverter.

The controller 34 may also be configured so that the select signal for the diverter 38 produced by the controller 34 may also be based on using what can be called "trend lines" of the individual measurements over the first predetermined length interval of time of the metal, e.g., copper, content of the ore percentages on feed conveyor 28 as part of the sorting criteria to dynamically control the diverter. Thus, the controller 34 can use the copper percentage analysis data to prepare a running average trend line for the copper content of the marginal grade ore on the conveyor 28 to dynamically adjust the cut-off value up or down to the adjusted value as a function of the trend lines. For example, as can be seen in FIG. 5 a plurality of trend lines are shown by thick broken lines Z. Each of the lines Z represents trends showing how the percentage content is increasing or decreasing as the pods of the ore on the feed conveyor travel through the first analyzer unit 32B. Thus, each of the trend lines has a direction and slope, and each of the trend lines is defined by a line of best fit for the sequential values of the first electrical signals making up that trend line. The variations in the direction and slope of the trend lines are used by the controller 34 to determine whether or not to further adjust the adjusted value. Eleven such trend lines are shown in FIG. 5 and are labeled as A to L. In the example shown in FIG. 5, when the trend line is heading upwards such as E to F or G to H, the controller 34 can be set to direct the diverter 38 to send more marginal ore to the product path and less to waste path. The reason for this is that when the ore contains a higher copper percent content one can increase copper recovery from the ore while ensuring that the product ore sent to the product conveyor 68 is close to an average copper content of 0.3% of the product over a second predetermined length interval of time. When the trend line is heading down such as D to E and F to G, the controller can be used to direct the diverter to allow less marginal ore to go to product path and more to the waste path. Again, this is so that the average copper content of the ore over the second predetermined length interval of time sent to the product stockpile is close to the required average 0.3% copper content of the product.

As mentioned earlier the second analyzer unit magnetic resonance analyzer 54B is constructed similarly to the first unit 32B. It has two purposes. The first purpose is to analyze the product copper content of ore material on the product conveyor 68 to determine the actual average copper content percent by weight of the ore passing through the magnetic analyzer over a second predetermined length interval of time and for providing to the controller 34 second electrical signals indicative of the average percentage by weight of metal in the metal-bearing ore on the product conveyor measured over the second predetermined length intervals of time, thus providing the actual measured values for the average metal in the product metal-bearing ore. This should confirm the estimated average metal in the product metal-bearing ore determined from the measurements of the input metal-bearing ore on the feed conveyor 28 before the input metal-bearing ore with an average metal above the cut off was separated at the diverter.

The second purpose of the second analyzer 54B is to feedback the actual measured average percentage of metal in the product metal-bearing ore to act as a calibration or fine-tune adjustment for the estimated average metal content in the product metal bearing ore measured at the first analyzer. In particular, the second magnetic resonance analyzing unit 54B is configured for measuring the percentage by weight of the metal in the product metal-bearing ore on the product conveyor 68 and for providing to the controller 34 signals to fine tune the adjusted value up or down to a tuned adjusted value to produce the select signals if the average percentage by weight of the metal in the product metal-bearing ore on the second conveyor is below or above the desired target average percentage by weight of the metal in the product metal-bearing ore. That action causes the diverter 38 to direct the input metal-bearing ore on the feed conveyor 28 to the collection path when the average percent by weight of the metal in the input metal-bearing ore on that conveyor is equal to or greater than the tuned adjusted value and to direct of the input metal-bearing ore on that conveyor to the waste path when the average percent by weight of the metal in the input metal-bearing ore on that conveyor is less than the tuned adjusted value.

Since the separation mechanism at the diverter 38 may result in loss of some input metal-bearing ore that should have gone to the collection path, but which spilled to the waste path, or the gain of some input metal-bearing ore that should have gone to the waste path, but which spilled to the collection path, it is possible that the measured and estimated values are not completely consistent over a predetermined time period and therefore this second analysis is essential to both know the metal content in the product metal-bearing ore over a given relatively long time period, e.g., fifteen minutes, and be able to make necessary adjustments to optimize or fine-tune the adjusted value for the desired product output. An example would be dynamically changing the time interval for the measurement on the first analyzer to increase or decrease the weight of a pod of material to regulate the frequency of changing the diverter flow.

Turning now to FIGS. 2 and 3, the details of the construction and operation of the diverter chute 36 and the pivoting chute diverter 38 will now be described. As can be seen the diverter chute 36 is a hollow housing having an opening 36A through which the output end of the feed conveyor 28 extends so that the portion of the belt 28B extending about the head pulley 28A, is located within the interior of a diverter chute 36.

As mentioned above the diverter 38 is preferably a pivoting chute type diverter. One particularly suitable diverter is available from Vortex Global Corporation, Salina Kans. USA under the model designation "Titan Series". The Titan Series of pivoting chute diverters are designed to receive a vertically falling stream of ore pieces at their inlet. Thus, the outlet chute 36A of the diverter chute is coupled to the inlet of the diverter 38. The inlet of the diverter 38 leads to a pivoting spout 38A, which is pivoted from side to side by a lever arm 38B coupled to a hydraulic actuator 38C. The diverter includes two outlet chutes, namely a "product" chute 38D and a "waste" chute 38E. The product chute 38D is open at its bottom and is arranged to receive ore from the pivoting spout when the spout is in the position shown in FIG. 2 to pass the ore into the product path. The waste chute 38E is open at its bottom and is arranged to receive ore from the pivoting spout when the spout is in the position shown in FIG. 3 to pass the ore into the waste path.

The hydraulic actuator is under control of electrical signals from the PLC controller 34. In particular, when the controller produces the heretofore mentioned select signal, the actuator will pivot the spout 38A to the position shown in FIG. 2, whereupon the ore pieces exiting the spout will drop out of the spout and pass through the product chute 38D into the bin 46. Otherwise the spout will be in position shown in FIG. 3, whereupon the ore pieces exiting the spout will drop out of the spout and pass through the waste chute 38E to the conveyor 40. The hydraulic actuator's stroke movement and speed can be controlled to split the discharge from the feed conveyor 28 to either chute 38D or 38E as required under the control of the controller 34.

Since fine ore particles or pieces, commonly known as "fines" below about 4 mesh Tyler screen size tend to stick to the belt 28B so as to be carried around the head pulley 28A further than coarser ore particles or pieces, the chute diverter 36 includes a belt scraper 28C. The belt scraper 28C is located immediately adjacent the belt 28B at the head pulley 28A to scrape off any fines which would tend to stick to the belt 28B as it is carried around the head pulley 28A.

The following are some commercially available components that can be used for an implementation of the exemplary sorting system 20 described above.

Magnet 24—Eriez Manufacturing Company (USA)

Magnetic Resonance Analyzers 32B and 55B—NextOre Pty Ltd, Australia

Belt weightometers 32A and 54A (including belt speed measurement device and calibration check weights and calibrating mechanism)—Siemens Milltronics (Germany/USA), Thermo Scientific Ramsey (USA), and Thayer Scale, Hyer Industries, Inc. (USA)

Diverter 38 (including hydraulic actuator and pumping system and controls)—Vortex Global Inc. (USA)

Belt scraper 28C—Martin Engineering (USA)

Turning now to FIGS. 6-9, there is shown another exemplary, and more preferred, embodiment 100 of a sorting system constructed in accordance with this invention. The sorting system 100 includes an Ore Sizing Station 102, an Analysis And Selection Station 104, the heretofore described Product Output Station 60, and a Waste Output Station 108. Each of those stations will be described in detail later, except for the Product Output Station 60 since it has been described earlier with respect to system 20.

Figure 6:
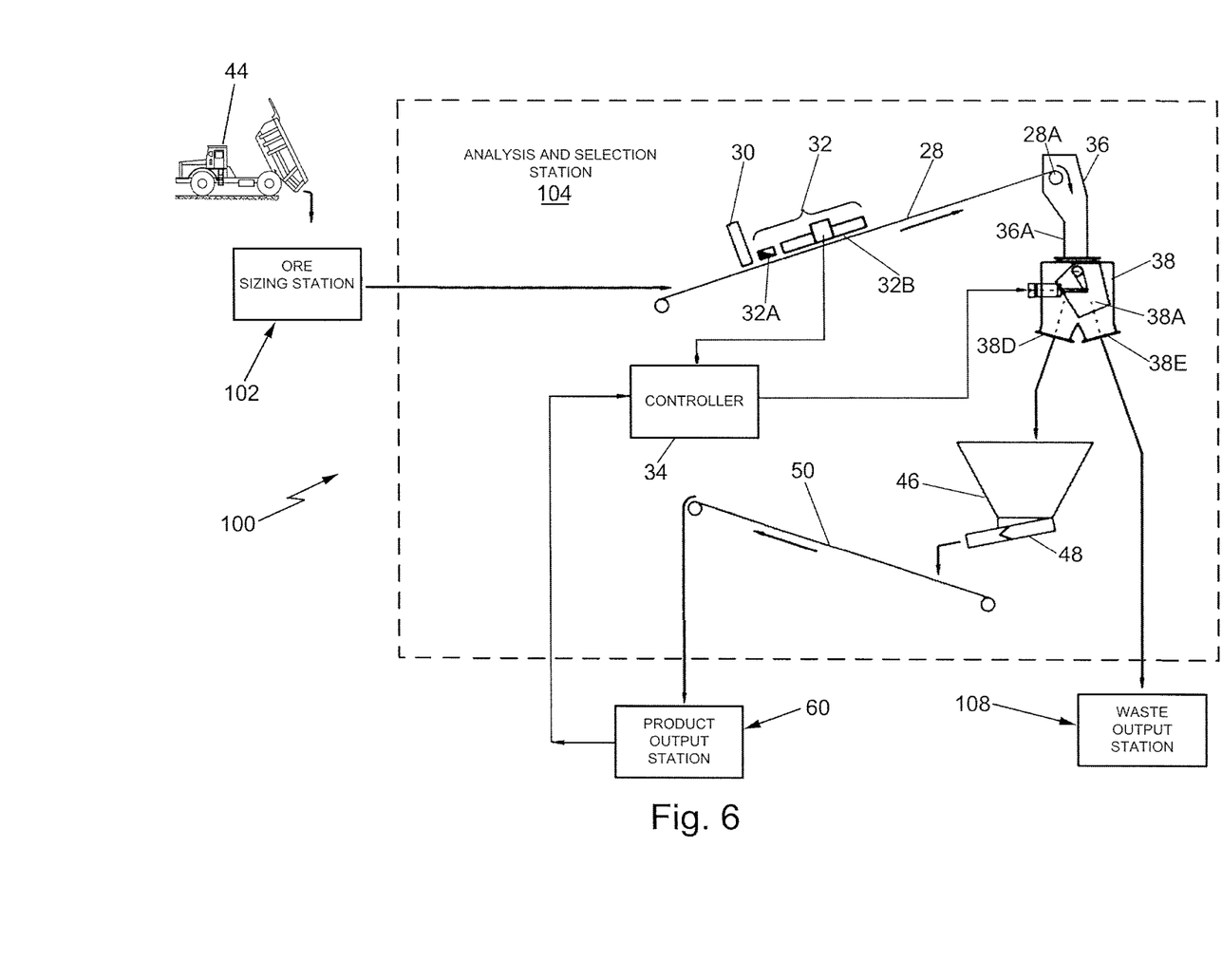
FIG. 6 an illustrative diagram showing another exemplary embodiment of a sorting system of this invention including an ore sizing station, an analysis and selection station, a product output station, and a waste output station, the system being configured for sorting and collecting copper-bearing ore having a desired target value of average weight percent of copper therein from copper-bearing ore provided to the system, for sizing the ore from the mine, sizing the output ore, and sizing the waste product.

Suffice it for now to state that the Ore Sizing Station 102 is configured for receiving ore, e.g., copper-bearing ore, from a mine and for sizing that ore, i.e., reducing the size of the pieces of ore so that none exceeds a desired predetermined maximum size (e.g., 150 mm). The sizing of the ore enables it to be efficiently analyzed and sorted (selected) by the Analysis And Selection Station 104. The Analysis And Selection Station 104 is identical in construction and operation to the portion of the system 20 that effects the analyzing and sorting (selecting) of the ore as described above, i.e., the components 28, 30, 32, 34, 36, 38, 46, 48, 50, 52 and 54. Thus, in the interest of brevity the common components the Analysis And Selection Station 104 of the system 100 and the corresponding portion of the system 20 will be given the same reference numbers, and the construction, arrangement and operation of those components will not be described in detail or reiterated herein. So too, since the Product Output Station 60 of the system 100 is identical to the Product Output Station 60 of the system 100 the components of the Product Output Station 60 of the system 100 will be given the same reference numbers, and the construction, arrangement and operation of those components will not be described in detail or reiterated herein. Thus, all that will be said about the Product Output Station 60 of the system 100 is that it is configured for receiving processed ore, i.e., metal-bearing ore having the desired average target grade of metal, e.g., copper, therein, from the Analysis And Selection Station 104 and sizing that ore, i.e., reducing the size of the pieces of the ore so that none exceeds a desired predetermined maximum (e.g., 10 mm). By so doing one is able to produce a metal-bearing ore that it particularly suitable for further processing, e.g., to extract the metal therefrom.

The Waste Output Station 108 is configured for the receiving waste ore, i.e., the metal-bearing ore having less than the desired average target grade of metal therein, from the Analysis And Selection Station 104 and sizing that waste ore, i.e., reducing the size of the pieces of the ore so that none exceeds a desired predetermined maximum. By so doing one can use the waste material economically, e.g., as an aggregate sub-base of road beds, etc. For such a use the predetermined maximum size of the pieces of waste ore is approximately 50 mm.

Figure 7:
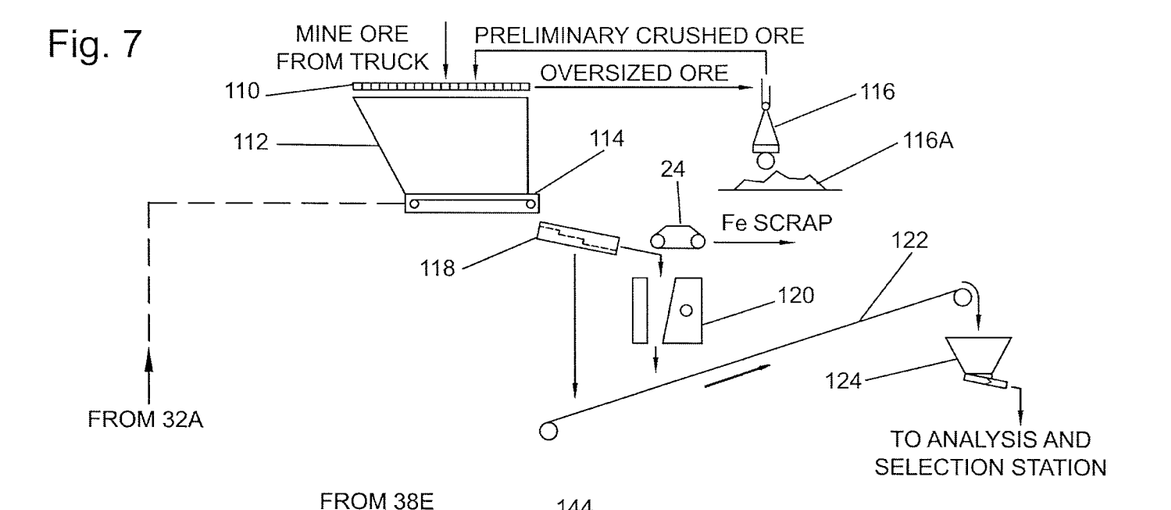
FIG. 7 is an illustrative diagram of the sizing station of FIG. 6.
Figure 8:
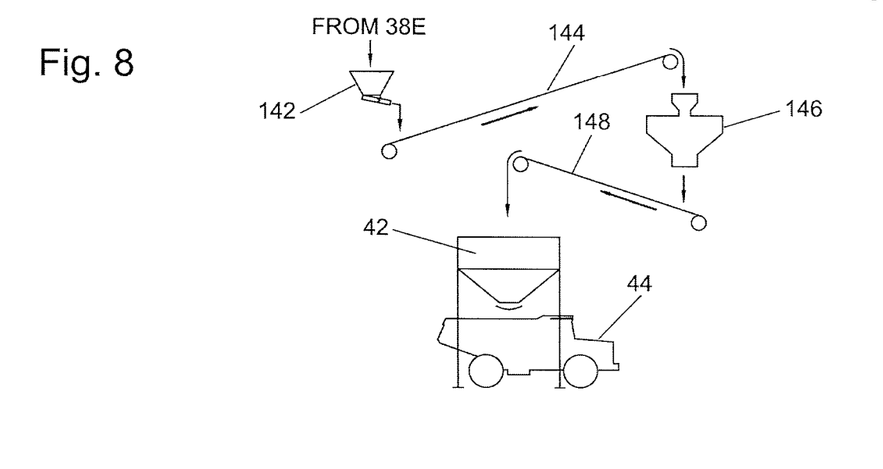
FIG. 8 is an illustrative diagram of the product output station of FIG. 6.

Turning now to FIG. 7, the details of the Ore Sizing Station 102 will now be described. That station basically comprises a static grid or screen 110, a feed bin 112, an apron feeder 114, a drop ball crusher 116, a grizzly screen 118, a magnet 24 (like the magnet 24 of the system 20), a primary ore crusher 120, a conveyor 122, and a surge bin 124. The static grid or screen 110 is disposed over the feed bin 112, is configured to enable pieces of metal-bearing ore which are no greater than a predetermined maximum size, e.g., 450 mm, to pass therethrough into the feed bin 112. The feed bin can be of any size. One exemplary size is 120 cubic meters. The metal-bearing ore is delivered to the static grid or screen 110 from a mine by a dump truck 44. The outlet of the feed bin 112 is the apron feeder 114, which is configured to carry the pieces of the ore that are no greater than the predetermined maximum size to the grizzly screen 118. That screen forms the first sizing screen of the Ore Sizing Station 102. Pieces of ore which are greater than the predetermined maximum size (identified as "OVERSIZED ORE" in FIG. 7) are provided into a pile 116A under the drop ball ore crusher 116. The ball of that device is configured to be dropped onto the pile 116A to crush the metal-bearing ore pieces of the pile into smaller pieces. Those crushed smaller pieces (identified as "PRELIMINARY CRUSHED ORE" in FIG. 7) are then carried back to the preliminary sizing screen 112, so that pieces thereof which are less than or equal to the predetermined maximum size drop into the bin 110, from whence they pass to the apron feeder. Any pieces of the preliminary crushed ore which are still greater than the predetermined maximum size are brought back from the pile 116A to be crushed again by the ball crusher and the resulting preliminary crushed ore brought back to the preliminary sizing screen.

The grizzly screen 118 is configured to enable pieces of the metal-bearing ore deposited on it by the apron feeder 114 which are not greater than a predetermined maximum size, e.g., 150 mm, to pass therethrough, from whence they fall onto the conveyor 122. That conveyor is a belt conveyor of conventional construction, which includes a circulating belt to carry the ore deposited on its upper surface thereof in the direction of the arrow shown at a predetermined rate of speed to the surge bin 124. Those pieces of metal-bearing ore which are greater than that predetermined maximum size are carried past the magnet 24, which removes any ferrous materials from the metal-bearing ore. The pieces of ferrous-free metal-bearing ore are provided to the primary ore crusher 120. That device is a conventional device which is configured to crush the pieces of ore brought to it into pieces not to exceed the predetermined maximum size, e.g., 150 mm, whereupon those pieces are dropped onto the conveyor 122 to be carried to the surge bin 124. The surge bin 124 is a conventional unit which includes a level sensor and is configured to provide the ore from it at a controlled rate to the conveyor 28 of the Analysis And Selection Station 104 so that there is a constant fill factor of ore, e.g., approximately 20%-30% by weight, on the conveyor 28 to ensure that the MR analyzer 32 works efficiently.

The ore deposited on the conveyor 28 is processed as described above with respect to system 20, with the metal-bearing ore upon which the Analysis And Selection Station 102 operates being referred to as the "processing ore", and with the metal-bearing ore diverted from the first conveyor 28 to the second conveyors 50 and 52 by the diverter 38 being referred to as the "selected processing ore". The selected processing ore exiting the second conveyor 52 is provided as the input to the Product Output Station 106.

The ore directed to the waste path by the diverter 38 is provided to the Waste Output Station 108. That station is best seen in FIG. 9 and basically comprises a surge bin 142, a conveyor 144, a waste ore crusher 146, and a conveyor 148. The surge bin 142 includes a level sensor. The surge bin is configured to receive the pieces of ore directed to the waste path by the diverter 38, from whence those pieces of ore are dropped onto the conveyor and conveyed to the waste ore crusher 146. The waste ore crusher is also a conventional unit and serves to crush the ore delivered to it into smaller pieces, which do not exceed a predetermined maximum size, e.g., 50 mm. Those pieces serve as a good aggregate for roadbeds and other similar uses. Thus, the pieces of waste ore (the aggregate) which exit the waste ore crusher 146 are deposited on the conveyor 148. The pieces of ore are carried by that conveyor to the exit end thereof, from whence they drop into a bin 42. The pieces of aggregate deposited into the bin by the conveyor can be dispensed from the bin when desired to be loaded into the bed of a dump truck 44 for transportation to some other site for subsequent use, e.g., for use as an aggregate roadbed.

The following are some commercially available components that can be used for an implementation of the exemplary sorting system 20 described above.

Magnet 24—Eriez Manufacturing Company (USA)

Magnetic Resonance Analyzers 32B and 55B—NextOre Pty Ltd, Australia

Belt weightometers 32A and 54A (including belt speed measurement device and calibration check weights and calibrating mechanism)—Siemens Milltronics (Germany/USA), Thermo Scientific Ramsey (USA), and Thayer Scale, Hyer Industries, Inc. (USA)

Diverter 38 (including hydraulic actuator and pumping system and controls)—Vortex Global Inc. (USA)

Belt scraper 28C—Martin Engineering (USA)

Grizzly screen 118—Aury (Tianjin) Industrial Technology Co. Ltd. (China)

Primary ore crusher 120—Sandvik Mining & Rock Technology (Sweden)

Secondary ore crusher 126—Metso Corporation (Finland)

Single deck sizing screen 130—Aury (Tianjin) Industrial Technology Co. Ltd. (China)

Tertiary ore crusher 136—Metso Corporation (Finland)

It should be pointed out at this juncture that the sorting systems as described above are merely two exemplary embodiments of various sorting systems that can be constructed in accordance with this invention. Thus, for sorting copper-bearing ore the particular system components and their arrangement can be chosen as desired, providing that the system includes two magnetic resonance analyzer units and any type of diverter, wherein a first magnetic resonance analyzer unit controls the diverter to divert input copper-bearing ore to a product line when predetermined sorting criteria, e.g., a cut-off average percent value for a first predetermined length interval of time, is met, and a second magnetic resonance analyzer unit to measure the actual average percent content of the ore over a second predetermined length interval of time in the product line to dynamically adjust the sorting criteria to result in a product ore having a desired average percentage by weight of copper as measured over a second predetermined length interval of time. Furthermore, while it is preferred that the system include the ore sizing station, the product output station and the waste output station, any or all of such stations can be omitted if desired. Moreover, if any or all of such stations are included in the system, they need not be constructed and arranged as specifically disclosed above. Thus, alternative stations can be provided for sizing the ore from the mine to an acceptable size for processing by the system of this invention. So too, alternative stations can be provided for sizing the output ore from the system. If sizing of the waste material is desired, alternative stations for effecting that end can be provided. Further still, as stated earlier the subject invention is not limited to sorting copper-bearing ore, but can be used to sort other metal bearing ore that can be analyzed by magnetic resonance.

Without further elaboration the foregoing will so fully illustrate our invention that others may, by applying current or future knowledge, adopt the same for use under various conditions of service.

We claim:

1. A system for producing pieces of a product metal-bearing ore by processing pieces of an input metal-bearing ore, the input metal-bearing ore having a metal therein, the product metal-bearing ore having a desired target average percentage by weight of the metal therein, said system comprising:

a first conveyor configured to receive the input metal-bearing ore;

a second conveyor configured to carry pieces of the product metal-bearing ore for collection after said system has processed the input metal-bearing ore;

a first magnetic resonance analyzing unit and an associated controller configured for measuring the percentage by weight of the metal in the input metal-bearing ore on said first conveyor at successive points in time, calculating the average percentage by weight of the metal in the input metal-bearing ore on said first conveyor measured over first predetermined length intervals of time, establishing a cut-off value of the average percentage by weight of the metal in the input metal-bearing ore on said first conveyor for producing the product metal-bearing ore, producing select signals when the average percentage by weight of the metal in the input metal-bearing ore on the first conveyor is equal to or greater than said cut-off value, generating an estimate of the average percentage by weight of the metal in the product metal-bearing ore, and dynamically adjusting said cut-off value up or down to an adjusted value to produce said select signals if the average percentage by weight of the metal in the input metal-bearing ore on said first conveyor is below or above the estimate of the average percentage by weight of the metal in the input metal-hearing ore on said first conveyor;

a diverter configured for receiving the input metal-bearing ore from said first conveyor and directing the input metal-bearing ore on said first conveyor to a collection path in response to said select signals when the average percent by weight of the metal in the input metal-bearing ore on said first conveyor is equal to or greater than said adjusted value and directing the input metal-bearing ore on said first conveyor to a waste path when the average percent by weight of the metal in the input metal-bearing ore on said first conveyor is less than said adjusted value;

and a second magnetic resonance analyzing unit configured for measuring the percentage by weight of the metal in the product metal-bearing ore on said second conveyor and for providing to said controller signals to fine tune said adjusted value up or down to a tuned adjusted value to produce said select signals if the average percentage by weight of the metal in the product metal-bearing ore on said second conveyor is below or above the desired target average percentage by weight of the metal in the product metal-bearing ore, thereby causing said diverter to direct the input metal-bearing ore on said first conveyor to said collection path when the average percent by weight of the metal in the input metal-bearing ore on said first conveyor is equal to or greater than said tuned adjusted value and to direct of the input metal-bearing ore on said first conveyor to said waste path when the average percent by weight of the metal in the input metal-bearing ore on said first conveyor is less than said tuned adjusted value.

2. The system of claim 1 wherein said controller is configured for collecting data from said first magnetic resonance analyzing unit and organizing that data into trend lines, each of said trend lines having a direction and slope and being a line of best fit for the sequential measurements of the percentage by weight of metal in the input metal-bearing ore measured over said first predetermined length intervals of time on said first conveyor, said controller being configured for dynamically adjusting said cut-off value up or down to said adjusted value as a function of the direction and slope of said trend lines.

3. The system of claim 1, wherein each of said conveyors are at least 75 feet long, wherein said predetermined speed of said first conveyor is in the range of 180 to 600 feet per minute, and wherein said first predetermined period of time is in the range of 1 to 10 seconds.

4. The system of claim 1, wherein the metal-hearing ore is copper-hearing ore and wherein the metal is copper.

5. The system of claim 4 wherein the desired target average percentage by weight of the copper is approximately 0.3%.

6. The system of claim 1, wherein said diverter is a selected from the group consisting of a pivoting chute diverter, a diverter gate valve and a flop gate.

7. A method for producing pieces of a product metal-bearing ore by processing pieces of an input metal-bearing ore, the input metal-bearing ore having a metal therein, the product metal-bearing ore having a desired target average percentage by weight of the metal therein, the method comprising:

providing the metal-bearing ore on a first conveyor;

measuring the percentage by weight of the metal in the input metal-bearing ore on the first conveyor at successive points in time;

calculating the average percentage by weight of the metal in the input metal-bearing ore on the first conveyor measured over first predetermined length intervals of time;

establishing a cut-off value of the average percentage by weight of the metal in the input metal-bearing ore on the first conveyor for producing the product metal-bearing ore;

producing select signals when the average percentage by weight of the metal in the input metal-bearing ore on the first conveyor is equal to or greater than the cut-off value;

generating an estimate of the average percentage by weight of the metal in the product metal-bearing ore;

dynamically adjusting the cut-off value up or down to an adjusted value to produce the select signals if the average percentage by weight of the metal in the input metal-bearing ore on the first conveyor is below or above the estimate of the average percentage by weight of the metal in the input metal-bearing ore on the first conveyor;

directing the input metal-bearing ore on the first conveyor to a collection path in response to the select signals when the average percent by weight of the metal in the input metal-bearing ore on the first conveyor is equal to or greater than the adjusted value;

directing the input metal-bearing ore on the first conveyor to a waste path when the average percent by weight of the metal in the input metal-bearing ore on the first conveyor is less than the adjusted value; and measuring the percentage by weight of the metal in the product metal-bearing ore on a second conveyor and fine tuning the adjusted value up or down to a tuned adjusted value to produce the select signals if the average percentage by weight of the metal in the product metal-bearing ore on the second conveyor is below or above the desired target average percentage by weight of the metal in the product metal-bearing ore, whereupon the input metal-bearing ore on the first conveyor is directed to the collection path when the average percent by weight of the metal in the input metal-bearing ore on the first conveyor is equal to or greater than the tuned adjusted value and the input metal-bearing ore on the first conveyor is directed to the waste path when the average percent by weight of the metal in the input metal-bearing ore on the first conveyor is less than the tuned adjusted value.

8. The method of claim 7 additionally comprising dynamically adjusting the cut-off value up or down to the adjusted value as a function of a direction and slope of trend lines, each of said trend lines being a line of best fit of the sequential measurements of the percentage by weight of metal in the input metal-bearing ore measured over said first predetermined length intervals of time on said first conveyor.

9. The method of claim 7 wherein the metal-bearing ore is copper-bearing ore and wherein the metal is copper.

10. The method of claim 9, wherein the desired target average percentage by weight of the copper is 0.3%.

* * * * *